United States Patent
Sandhu et al.

(10) Patent No.: US 6,764,956 B2
(45) Date of Patent: Jul. 20, 2004

(54) METHODS OF TREATING DIELECTRIC MATERIALS

(75) Inventors: Gurtej S. Sandhu, Boise, ID (US); Trung Tri Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/226,894

(22) Filed: Aug. 23, 2002

(65) Prior Publication Data

US 2003/0045130 A1 Mar. 6, 2003

Related U.S. Application Data

(62) Division of application No. 09/945,308, filed on Aug. 30, 2001, now Pat. No. 6,573,199.

(51) Int. Cl.[7] ............................................. H01L 21/302
(52) U.S. Cl. ......................................................... 438/715
(58) Field of Search ................................ 438/514–516, 438/795–798, 800, 251, 715

(56) References Cited

U.S. PATENT DOCUMENTS

| | | | |
|---|---|---|---|
| 4,839,196 A | 6/1989 | Itoh | |
| 5,468,687 A | 11/1995 | Carl et al. | |
| 5,508,221 A | 4/1996 | Kamiyama | |
| 5,510,158 A | * 4/1996 | Hiramoto et al. | 427/582 |
| 5,547,716 A | 8/1996 | Thaler | |
| 5,783,716 A | 7/1998 | Baum et al. | |
| 6,103,567 A | * 8/2000 | Shih et al. | 438/251 |
| 6,150,209 A | 11/2000 | Sun et al. | |
| 6,297,086 B1 | 10/2001 | Hegde et al. | |
| 6,376,327 B2 | 4/2002 | Sandhu et al. | |
| 6,395,650 B1 | 4/2002 | Callegari et al. | |
| 6,432,793 B1 | 8/2002 | Reinberg | |

FOREIGN PATENT DOCUMENTS

| | | |
|---|---|---|
| JP | 01262680 A | 12/1986 |
| JP | 05186875 A | 7/1993 |
| JP | 06115912 A | 4/1995 |
| JP | 02001185548 A | 7/2001 |

OTHER PUBLICATIONS

DeBoer et al., U.S. Patent Application Pub. No. US 2001/0035752 A1, Pub. Date Nov. 1, 2001.
Cranciun et al., "Low Temperature Growth of Barium Strontium Titanate Films by Ultraviolet–Assisted Pulsed Laser Deposition", Mat. Res. Symp. vol. 617, pp. J3.21.1–J3.21.6, 2000. Year is sufficiently early such that the month is not an issue.

* cited by examiner

Primary Examiner—Craig A. Thompson
(74) Attorney, Agent, or Firm—Wells St. John P.S.

(57) ABSTRACT

The invention includes a method of treating a predominantly inorganic dielectric material on a semiconductor wafer. A laser is utilized to generate activated oxygen species. Such activated oxygen species react with a component of the dielectric material to increase an oxygen content of the dielectric material. The invention also includes a method of forming a capacitor construction. A first capacitor electrode is formed to be supported by a semiconductor substrate. A dielectric material is formed over the first capacitor electrode. A precursor is provided at a location proximate the dielectric material, and a laser beam is focused at such location. The laser beam generates an activated oxygen species from the precursor. The activated oxygen species contacts the dielectric material. Subsequently, a second capacitor electrode is formed over the dielectric material.

46 Claims, 2 Drawing Sheets

METHODS OF TREATING DIELECTRIC MATERIALS

RELATED PATENT DATA

This patent resulted from a divisional application of U.S. patent application Ser. No. 09/945,308 which was filed on Aug. 30, 2001 now U.S. Pat. No. 6,573,199.

TECHNICAL FIELD

The invention pertains to methods of treating dielectric materials with oxygen, and in particular embodiments pertains to methods of forming capacitor constructions.

BACKGROUND OF THE INVENTION

Dielectric materials are incorporated into numerous semiconductor constructions, including, for example, capacitor constructions. The dielectric materials will frequently comprise an oxide, such as, for example, one or more of silicon dioxide, silicon oxynitride, and tantalum pentoxide. A difficulty that can occur in forming such dielectric materials is that there can be regions within the materials which are oxygen deficient. For instance, there can be regions within a tantalum pentoxide material in which the ratio of tantalum to oxygen is higher than that which exists in the stoichiometric material $Ta_2O_5$. Such regions have a lower dielectric constant than would exist if the regions had sufficient oxygen to reach the stoichiometry of $Ta_2O_5$.

It is typical for a dielectric material to comprise oxygen-deficient regions interspersed within a material that predominantly is not oxygen deficient. For instance, it is common for $Ta_2O_5$ to be formed under conditions in which the majority of the material comprises the stoichiometry of $Ta_2O_5$, and in which oxygen-deficient regions are interspersed throughout the tantalum pentoxide material. The oxygen-deficient regions can disrupt a uniformity of the physical properties of the tantalum pentoxide material. For instance, the oxygen-deficient regions can disrupt the uniformity of dielectric strength throughout the tantalum pentoxide material. Disruption of the physical properties of the tantalum pentoxide material can cause inconsistencies in device performance from semiconductor devices incorporating the dielectric material, which can reduce performance of the devices and, in particularly problematic cases, can render the devices inoperable.

A solution to the problem of having oxygen-deficient regions within a dielectric material is to expose the material to an oxidant to cure oxygen deficiencies within the material. For instance, dielectric materials can be exposed to ozone to cure oxygen deficiencies within the materials. A difficulty which is frequently encountered is that the oxidants do not cure enough of the oxygen deficiencies within a dielectric material to acceptably overcome the above-described problems associated with having oxygen deficiencies interspersed throughout a dielectric material. Accordingly, it would be desirable to develop new methods for reducing the oxygen deficiencies within a dielectric material, and it would be particularly desirable if such methods could entirely eliminate oxygen deficiencies throughout a dielectric material.

SUMMARY OF THE INVENTION

In one aspect, the invention encompasses a method of treating a predominantly inorganic dielectric material on a semiconductor wafer. A laser is utilized to generate activated oxygen species. Such activated oxygen species react with a component of the dielectric material to increase an oxygen content of the dielectric material.

In another aspect, the invention encompasses a method of forming a capacitor construction. A first capacitor electrode is formed to be supported by a semiconductor substrate. A dielectric material is formed over the first capacitor electrode. A precursor is provided at a location proximate the dielectric material, and a laser beam is focused at such location. The laser beam generates an activated oxygen species from the precursor. The activated oxygen species contacts the dielectric material. Subsequently, a second capacitor electrode is formed over the dielectric material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

The invention includes methods of treating dielectric materials with activated oxygen species. The activated oxygen species can be formed by impacting an oxygen-containing material with a laser beam to change an electronic state of an oxygen component of the material, and thereby generate the activated oxygen species from such oxygen component. The activated oxygen species generated by the laser beam can interact with oxygen-deficient regions of the dielectric material to increase an oxygen content of such material. For instance, the activated oxygen species can directly react with components of the dielectric material associated with an oxygen-deficient region to bond with such components, and thereby increase an oxygen content of an otherwise oxygen-deficient region of the dielectric material.

Although methodology of the present invention can be utilized for treating any dielectric material, the methodology can offer particular advantages when utilized to treat predominantly inorganic dielectric materials. The term "predominantly inorganic" is used to indicate that less than 50 weight percent of the dielectric material is carbon. Typically, less than 10 weight percent of the material will be carbon. For instance, the dielectric material can comprise one or more of tantalum pentoxide, aluminum oxide, hafnium oxide, titanium oxide, strontium titanate, barium strontium titanate (BST) and silicon oxynitride. If the dielectric material is formed by chemical vapor deposition there can be a minor amount of carbon within the material due to incorporation of a small amount of carbon-containing components of chemical vapor deposition precursors into the dielectric materials. However, the amount of carbon within the dielectric material will typically be less than 10 weight percent, frequently less than 5 weight percent, and often even less than 1 weight percent.

Figure 1:
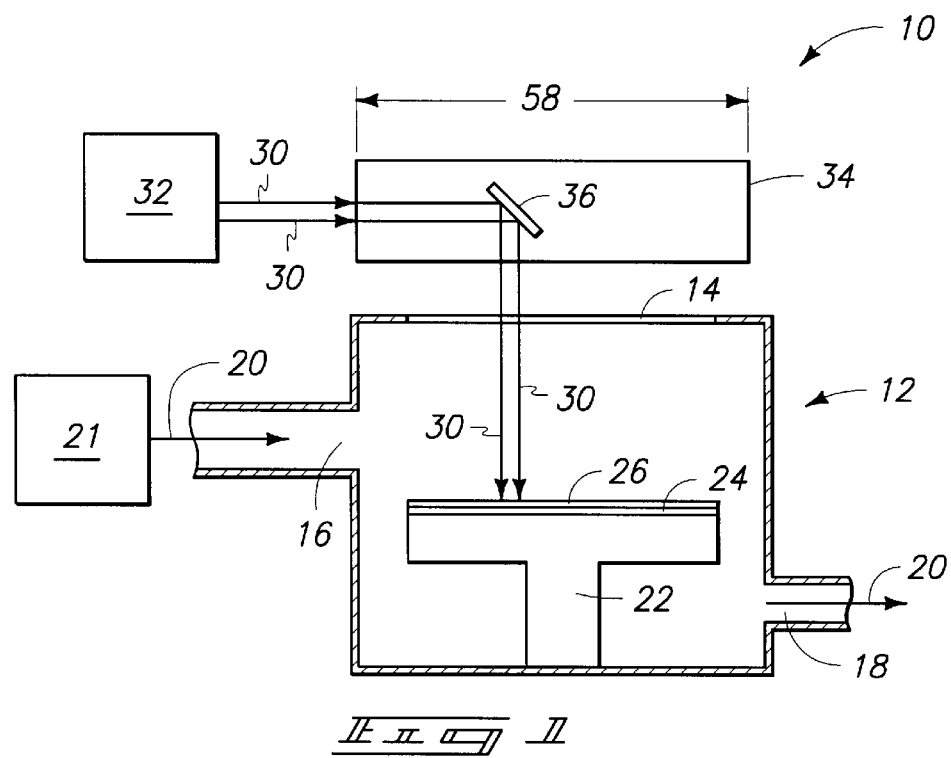
FIG. 1 is a diagrammatic, cross-sectional view of an apparatus configured for treatment of a dielectric material in accordance with a method of the present invention.

An exemplary method of the present invention is described with reference to FIGS. 1–4. Referring initially to FIG. 1, an apparatus 10 configured for treatment of a semiconductor substrate is illustrated. Apparatus 10 comprises a chamber 12 having a window 14 extending therein. Window 14 can comprise, for example, quartz.

Chamber 12 further comprises an inlet port 16 and an outlet port 18. A fluid 20 is flowed from a source 21 into chamber 12 through inlet port 16, and exits chamber 12 through outlet port 18. Fluid 20 comprises an oxygen-containing component. In particular embodiments, fluid 20 can comprise a gas, which includes, consists of, or consists essentially of ozone ($O_3$). The amount of ozone within fluid 20 can vary from about 0.1% concentration (by volume) to about 100% concentration. The ozone can be diluted in a second gas, such as, for example, $O_2$.

A support structure 22 is provided within chamber 12, and a semiconductor substrate 24 is provided to be supported by support structure 22. Support structure 22 can be referred to as a wafer holder. Support structure 22 can comprise components for temperature control of wafer 24 during processing of the present invention. Such components can include one or both of a heating component and a cooling component. In particular embodiments, wafer 24 will be heated during processing of the present invention, and accordingly support 22 will comprise heating components (not shown) which maintain wafer 24 at a desired temperature.

Wafer 24 has a dielectric material 26 provided over a surface thereof. Dielectric material 26 can comprise, for example, a predominantly inorganic dielectric material, such as silicon oxynitride and/or tantalum pentoxide.

Wafer 24 can be referred to herein as a semiconductor substrate. Alternatively, wafer 24 and dielectric material 26 can together be referred to as a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A laser beam 30 (illustrated by two arrows, but it is to be understood that the arrows can correspond to components of a single laser beam) is generated by a source 32 and directed into an optical array. Optical array 34 typically comprises focusing lenses (not shown) and one or more mirrors 36 (only one of which is shown). The mirrors 36 direct laser beam 30 through window 14, and toward a location proximate a surface of dielectric material 26. Laser beam 30 interacts with an oxygen-containing component of fluid 20 to generate an activated oxygen species. Such activated oxygen species can then react with dielectric material 26 to cure oxygen deficiencies within such material.

Laser beam 30 can predominantly comprise a single wavelength of light, and such wavelength can be chosen to interact with a specific oxygen-containing component of fluid 20. For instance, if fluid 20 comprises ozone, then laser beam 30 can comprise light having a wavelength of from 193 nm to 248 nm. Such light interacts with the ozone to generate an activated oxygen species. For instance, energy from the laser beam can cause $O_3$ to break down into an activated oxygen component and a diatomic oxygen component ($O_2$). The laser beam can be specifically chosen to interact only with specific oxygen-containing components of fluid 20, and not with other components. For instance, if fluid 20 comprises a mixture of $O_3$ and $O_2$, the laser beam wavelength(s) can be chosen such that the laser beam light interacts only with the $O_3$.

It can be desired to carefully control a concentration of laser-light absorbing materials within reaction chamber 12. For instance, if a laser-light absorbing material is $O_3$ it can be desired to control an amount of $O_3$ within reaction chamber 12. Specifically, if an amount of $O_3$ within the chamber is too high, the laser energy will be absorbed by the $O_3$ before the laser beam 30 has penetrated a sufficient distance within chamber 12 to reach a desired location proximate dielectric material 26. On the other hand, if the concentration of $O_3$ is too low, there will not be a sufficiently high flux of reactive oxygen species delivered proximate dielectric material 26 to react with the various oxygen-deficient regions within the dielectric material 26. In an exemplary method of the present invention, fluid 20 comprises a gaseous mixture of $O_3$ and $O_2$, with the $O_3$ being present to a concentration of about 1%–10% (by volume), and the mixture being flowed through chamber 12 at a rate of about 1000 standard cubic centimeters per minute (sccm). A distance from an upper surface of dielectric material 26 to window 14 is about 25 millimeters, and the laser beam 30 is focused at a location that is from about 2 millimeters to about 4 millimeters above an upper surface of dielectric material 26. Wafer 24 is heated to a temperature of about 300°°C. during such exemplary processing.

Figure 2:
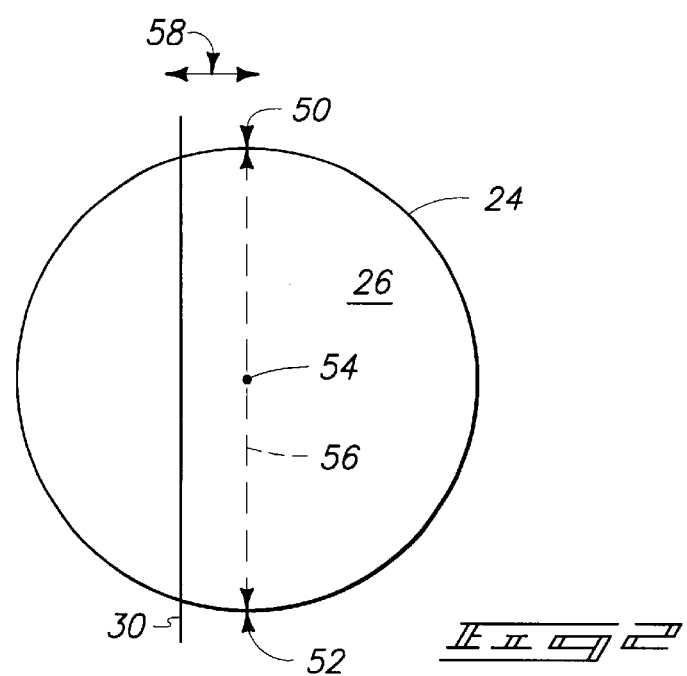
FIG. 2 is a diagrammatic top view of a semiconductor wafer treated in accordance with a method of the present invention.

Referring to FIG. 2, wafer 24 is illustrated in a top view to illustrate a location of laser beam 30 relative to an upper surface of dielectric material 26. Wafer 24 comprises a first edge 50 and an opposing second edge 52. Further, wafer 24 comprises a center 54 between edges 50 and 52. A distance 56 extends between edges 50 and 52, and across the center 54. In the shown preferred embodiment, laser 30 comprises a band which extends across a majority of the distance between edges 50 and 52, and specifically which extends across an entirety of the distance between edges 50 and 52. Band 30 is preferably passed across a surface of wafer 24 during processing of the present invention. An axis 58 is provided to show an exemplary direction along which band 30 can be passed relative to wafer 24 so that band 30 will ultimately pass across an entirety of wafer 24. The passing of band 30 relative to wafer 24 can be accomplished by moving one or both of wafer 24 or the laser beam corresponding to band 30. FIG. 1 describes an exemplary embodiment wherein wafer 24 is configured to be held stationary while laser beam 30 is passed across a surface of wafer 24. Specifically, the mirror assembly 36 can be moved along axis 58 to cause laser beam 30 to traverse along an entirety of the surface of wafer 24.

Although laser beam 30 is described as preferably being in the configuration of a long narrow band in the embodiment of FIGS. 1 and 2, it is to be understood that laser beam 30 can comprise other shapes, such as, for example, a circular beam which is traversed along the shown axis 58, and along another axis orthogonal to the shown axis (for instance, axis 58 can be considered to be a "X" axis, and the orthogonal axis would be a "Y" axis extending into and out of the page of FIG. 1) to traverse across an entirety of the upper surface of the wafer. Alternatively, the beam can be configured to be wide enough to cover an entirety of the surface of wafer 24 without being passed across such surface.

Figure 3:
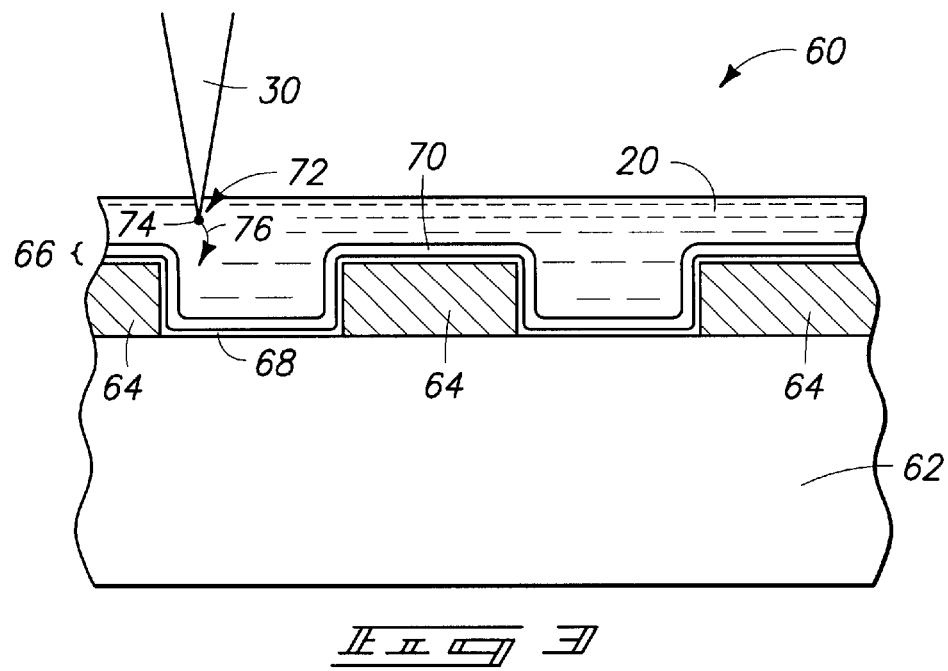
FIG. 3 is a diagrammatic cross-sectional side view of a semiconductor wafer fragment treated in accordance with a method of the present invention.
Figure 4:
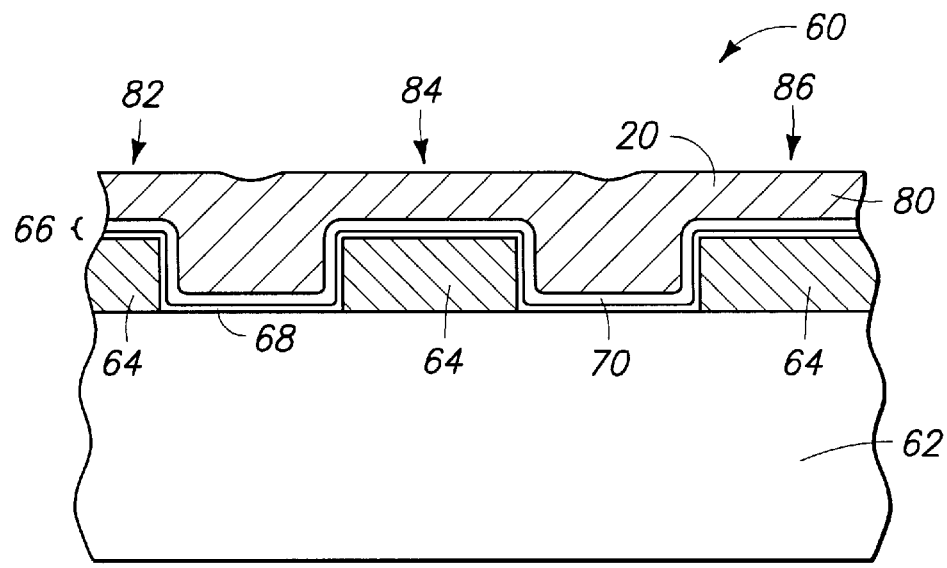
FIG. 4 is a view of the FIG. 3 wafer fragment shown at a processing step subsequent to that of FIG. 3.

FIGS. 3 and 4 illustrate an expanded view of a semiconductor wafer construction treated in accordance with methodology of the present invention.

Referring first to FIG. 3, such illustrates a wafer fragment 60 comprising a substrate 62. Substrate 62 can comprise a semiconductive material, such as, for example, monocrystalline silicon. Further, substrate 62 can comprise a stack of materials, such as, for example, a stack comprising an insulative material over various conductive and semiconductive materials.

Conductive blocks 64 are illustrated over substrate 62. Blocks 64 can comprise conductively-doped silicon and/or metal.

A dielectric material 66 is shown over substrate 62 and blocks 64. Dielectric material 66 comprises a first layer 68 and a second layer 70. First layer 68 can comprise silicon dioxide, silicon nitride, and/or silicon oxynitride. In particular embodiments, layer 68 comprises silicon oxynitride, and specifically comprises regions having the stoichiometry $Si_xO_yN_z$, wherein X, Y and Z are all greater than 0. Further, mass 68 has a ratio of silicon to oxygen within at least portions of the mass which correspond to regions which are oxygen deficient relative to a desired ratio of silicon to oxygen within such portions of the mass.

Layer 70 comprises a metal and oxygen, and in particular embodiments comprises tantalum and oxygen. Layer 70 can, in particular embodiments, comprise tantalum pentoxide having oxygen-deficient regions therein.

Fluid 20 is illustrated being flowed across a surface of dielectric material 70, and laser beam 30 is shown focused at a location 72 within fluid 20. An activated species 74 is generated within fluid 20 at the location 72. Activated species 74 can comprise, for example, an activated oxygen species. The activated species 24 can migrate from location 72 to the dielectric material 70, as indicated by arrow 76.

Once the activated species 74 reaches dielectric material 70, it can react with a component of dielectric material 70 (such as a metal component of a metal oxide) to form a bond to such-component The activated species can thereby increase a concentration of oxygen within the dielectric material to alleviate or cure an oxygen deficiency within such material. For instance, if material 70 comprises tantalum and oxygen, an activated oxygen species can react with the tantalum of oxygen-deficient regions to cure an oxygen deficiency within material 70.

It is noted that laser beam 30 can generate more than one activated species within a fluid 20, depending on the composition of the fluid, and also depending on the particular wavelength(s) of light present in the laser beam. If multiple activated species are generated, one or more of such species will preferably be capable of reacting with a component of dielectric material 70 and/or dielectric material 68 to increase a dielectric constant of at least a portion of the materials. The activated species can additionally, or alternatively, react with the component of dielectric material 70 and/or dielectric material 68 to reduce a leakage of current through one or both of materials 68 and 70. Reduction of leakage current can improve capacitive properties of constructions comprising materials 68 and 70.

In embodiments in which layer 68 comprises $Si_xO_yN_z$, an activated oxygen species 74 can migrate through material 70 to react with the silicon of the $Si_xO_yN_z$ to thereby decrease a ratio of silicon to oxygen within the material 68.

In one aspect, the interaction of activated species 74 with one or both of dielectric materials 68 and 70 can be considered to be interaction of an activated oxygen species with portions of either material 68 or 70 that are not fully oxidized, to increase an amount of oxidation of such portions.

In the shown embodiment, a focal point of laser beam 30 is above an uppermost surface of wafer fragment 60. Preferably, the focal point of laser 30 is a distance of from about 2 millimeters to about 4 millimeters above a surface of fragment 60 as the laser beam is passed across such surface. The distance of from about 2 millimeters to about 4 millimeters is close enough that activated species can migrate to the dielectric material associated with a surface of fragment 60, and yet far enough that the focal point of the laser beam does not inadvertently impact a surface of the dielectric material.

An advantage of methodology of the present invention is that such generates a high flux of activated species proximate a surface of a dielectric material which is to be treated with such activated species. Another advantage is that the laser beam is utilized to generate activated species, rather than being utilized to directly impact the dielectric material. In other words, the laser light is utilized to generate a migratory reactive species, rather than being directly utilized in any reaction occurring within dielectric material 70. Accordingly, the laser light can be focused at varying locations relative to dielectric material 70, and yet the migratory reactive species will traverse to the dielectric material and react therewith. In contrast, if the laser light were utilized directly in a reaction with the dielectric material, a focal point of the laser light would typically be directed at a surface of the dielectric material. Such can be problematic in applications, such as that shown, in which the dielectric material has an undulating upper surface, as it can be difficult to keep the laser beam focused on such undulating surface as the laser beam is passed across the surface. Another problem can occur in the difficulty of hitting vertical walls or surfaces with the laser energy. However, methodology of the present invention is simplified relative to processes in which a laser beam is focused at a surface of the dielectric material in that the present invention can utilize a laser beam which is focused within a range of locations above a surface of the dielectric material. It is to be understood, however, that the invention can also encompass embodiments wherein the laser beam is focused at the surface of the dielectric material and generates the reactive species against such surface, but such embodiments are generally less preferred than embodiments in which the laser beam is focused at a location above the surface of the dielectric material.

Referring next to FIG. 4, a conductive material 80 is formed over dielectric material 70. Conductive material 80 can comprise, for example, one or both of conductively-doped silicon and metal. Conductive material 80 and conductive material 64 define capacitor electrodes of spaced capacitor constructions 82, 84 and 86. Such capacitors comprise capacitor electrode 80 separated from capacitor electrode 64 by intervening dielectric material 66. The capacitor constructions can be incorporated into semiconductor devices. For instance, the capacitor constructions can be incorporated into dynamic random access (DRAM) devices by coupling the capacitor constructions with transistor gates (not shown) to form DRAM cells.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of reducing current leakage through at least a portion of a dielectric material of a semiconductor construction comprising:
   providing the semiconductor construction within a reactor;
   flowing an ozone-comprising fluid into the reactor; and
   utilizing a laser to generate from the ozone-comprising fluid, one or more activated species which react with a component of the dielectric material to reduce the leakage of current through the dielectric material.

2. The method of claim 1 wherein the activated species comprises an activated oxygen species which reacts with the component to increase an oxygen content of the dielectric material.

3. The method of claim 1 wherein the dielectric material comprises oxygen and one or more non-oxygen components, and wherein the activated species comprises an activated oxygen species which reacts with at least one of the non-oxygen components.

4. The method of claim 1 wherein the dielectric material is a predominantly inorganic material.

5. The method of claim 1 wherein the dielectric material comprises tantalum and oxygen, and wherein the activated species comprises a species which reacts with the tantalum component of the dielectric material.

6. A method of increasing a dielectric constant of at least a portion of a dielectric material of a semiconductor comprising:
   providing the semiconductor within a reactor;
   flowing an ozone-comprising fluid into the reactor; and
   utilizing a laser to generate from the ozone-comprising fluid, one or more activated species which react with a component of the dielectric material to increase the dielectric constant of the dielectric material.

7. The method of claim 6 wherein the activated species comprises an activated oxygen species which reacts with the component to increase an oxygen content of the dielectric material.

8. The method of claim 6 wherein the dielectric material comprises oxygen and one or more non-oxygen components, and wherein the activated species comprises an activated oxygen species which reacts with at least one of the non-oxygen components.

9. The method of claim 6 wherein the dielectric material is a predominantly inorganic material.

10. The method of claim 9 wherein the dielectric material comprises tantalum and oxygen, and wherein the activated species comprises a species which reacts with the tantalum component of the dielectric material.

11. A method of treating a predominantly inorganic dielectric material on a semiconductor wafer comprising:
    providing the semiconductor wafer within a reactor;
    flowing an ozone-comprising fluid into the reactor; and
    utilizing a laser to generate from the ozone-comprising fluid, at least one activated oxygen species which reacts with a component of the dielectric material to increase an oxygen content of the dielectric material.

12. The method of claim 11 wherein the activated oxygen species comprises a component formed by impacting $O_3$ with the laser beam.

13. The method of claim 11 wherein the dielectric material comprises a metal and oxygen, and wherein the activated oxygen species comprises a component which reacts with the metal component of the dielectric material.

14. The method of claim 11 wherein the dielectric material comprises tantalum and oxygen, and wherein the activated oxygen species comprises a component which reacts with the tantalum component of the dielectric material.

15. The method of claim 11 wherein the dielectric material comprises silicon and oxygen, and wherein the activated oxygen species comprises a component which reacts with the silicon component of the dielectric material.

16. The method of claim 11 wherein the wafer comprises a center, a first edge and an opposing second edge; the first edge being spaced from the opposing second edge by a distance across the center of the wafer, and wherein the laser beam comprises a region which extends a majority of the distance across the center of the wafer.

17. The method of claim 11 wherein the wafer comprises a center, a first edge and an opposing second edge; the first edge being spaced from the opposing second edge by a distance across the center of the wafer, and wherein the laser beam comprises a region which extends an entirety of the distance across the center of the wafer.

18. The method of claim 11 further comprising incorporating the treated dielectric material into a capacitor construction as at least a portion of a dielectric region between a pair of capacitor electrodes.

19. A method of treating a predominantly inorganic dielectric material on a semiconductor wafer comprising:
    providing the semiconductor wafer into a reaction chamber;
    generating ozone to produce an ozone-comprising fluid;
    flowing the ozone-comprising fluid into the reaction chamber; and
    passing a laser beam across at least a portion of a surface of the dielectric material to generate at least one activated species which contacts the dielectric material.

20. The method of claim 19 wherein the laser beam is passed across an entirety of the surface of the dielectric material.

21. The method of claim 19 wherein the passing the laser beam across the surface comprises moving the wafer relative to the laser beam.

22. The method of claim 19 wherein the passing the laser beam across the surface comprises moving the laser beam relative to the wafer.

23. The method of claim 19 wherein the laser beam comprises a region which extends a majority of a distance from one edge of the wafer to an opposing edge across a center of the wafer relative to said one edge.

24. The method of claim 19 wherein the laser beam comprises a region which extends an entirety of a distance from one edge of the wafer to an opposing edge across a center of the wafer relative to said one edge.

25. The method of claim 19 wherein the laser beam comprises a focussed region, said focussed region being in a shape of a band which extends a majority of a distance from one edge of the wafer to an opposing edge across a center of the wafer relative to said one edge.

26. The method of claim 19 wherein the laser beam comprises a focussed region, said focussed region being in a shape of a band which extends an entirety of a distance from one edge of the wafer to an opposing edge across a center of the wafer relative to said one edge.

27. The method of claim 19 wherein the laser beam is focussed at a location above the surface of the dielectric material, and wherein the laser beam impacts a substance at the location to form the at least one activated species; the at least one activated species migrating from the location to the surface of the dielectric material to contact said dielectric material.

28. The method of claim 19 wherein the laser beam is focussed at a location from about 2 mm to about 4 mm above the surface of the dielectric material, and wherein the laser beam impacts a substance at the location to form the at least one activated species; the at least one activated species migrating from the location to the surface of the dielectric material to contact said dielectric material.

29. The method of claim 28 wherein the substance comprises $O_3$, and wherein the activated species include activated oxygen.

30. The method of claim 19 wherein the activated species include activated oxygen.

31. The method of claim 19 further comprising incorporating the treated dielectric material into a capacitor construction as at least a portion of a dielectric region between a pair of capacitor electrodes.

32. A method of treating a predominantly inorganic dielectric material, comprising:
  introducing an ozone-comprising precursor into a reaction chamber to at a location proximate the dielectric material;
  providing a laser beam focussed at the location, the laser beam generating an activated oxygen species from the precursor; and
  contacting the activated oxygen species with the dielectric material.

33. The method of claim 32 wherein the precursor comprises $O_3$ diluted to a concentration of from at least about 1% to less than 100% in $O_2$.

34. The method of claim 32 wherein the location is from about 2 mm to about 4 mm above a surface of the dielectric material.

35. The method of claim 32 wherein the dielectric material comprises an oxide of a material, and wherein the activated oxygen species reacts with portions of the material that are not fully oxidized to increase an amount of oxidation of such portions.

36. The method of claim 32 wherein the dielectric material comprises tantalum oxide, and wherein the activated oxygen species reacts with portions of the tantalum oxide that have a higher ratio of tantalum to oxygen than $Ta_2O_5$ to convert such portions to $Ta_2O_5$.

37. The method of claim 32 wherein the dielectric material comprises silicon and oxygen, and wherein the activated oxygen species reacts with portions of the dielectric material to decrease the ratio of silicon to oxygen within the dielectric material.

38. The method of claim 32 wherein the dielectric material comprises tantalum oxide over a mass of $Si_xO_yN_z$, wherein x, y and z are greater than 0, and wherein the activated oxygen species reacts with one or both of (1) portions of the tantalum oxide that have a higher ratio of tantalum to oxygen than $Ta_2O_5$ to convert such portions to $Ta_2O_5$; and (2) portions of the mass of $Si_xO_yN_z$ to decrease the ratio of silicon to oxygen within the mass.

39. The method of claim 32 wherein the precursor is a fluid flowed across a surface of the dielectric material.

40. The method of claim 32 wherein the precursor is a gas flowed across a surface of the dielectric material.

41. The method of claim 32 further comprising incorporating the treated dielectric material into a capacitor construction as at least a portion of a dielectric region between a pair of capacitor electrodes.

42. The method of claim 1 wherein the dielectric material comprises at least one member selected from the group consisting of tantalum oxide, aluminum oxide, hafnium oxide, titanium oxide, strontium titanate, barium strontium titanate, and silicon oxynitride.

43. The method of claim 6 wherein the dielectric material comprises at least one member selected from the group consisting of tantalum oxide, aluminum oxide, hafnium oxide, titanium oxide, strontium titanate, barium strontium titanate, and silicon oxynitride.

44. The method of claim 11 wherein the dielectric material comprises at least one member selected from the group consisting of tantalum oxide, aluminum oxide, hafnium oxide, titanium oxide, strontium titanate, barium strontium titanate, and silicon oxynitride.

45. The method of claim 19 wherein the dielectric material comprises at least one member selected from the group consisting of tantalum oxide, aluminum oxide, hafnium oxide, strontium titanate, barium strontium titanate, and silicon oxynitride.

46. The method of claim 32 wherein the dielectric material comprises at least one member selected from the group consisting of tantalum oxide, aluminum oxide, hafnium oxide, titanium oxide, strontium titanate, barium strontium titanate, and silicon oxynitride.

* * * * *

UNITED STATES PATENT AND TRADEMARK OFFICE
CERTIFICATE OF CORRECTION

PATENT NO. : 6,764,956 B2
DATED : July 20, 2004
INVENTOR(S) : Gurtej Sandhu et al.

It is certified that error appears in the above-identified patent and that said Letters Patent is hereby corrected as shown below:

<u>Column 4,</u>
Line 28, please delete "300°°C." before "during" and insert -- 300°C. --.

<u>Column 5,</u>
Line 37, please delete "such-component" after "to" and insert -- such component. --.

<u>Column 6,</u>
Line 55, please insert -- memory -- after "access".

<u>Column 9,</u>
Line 17, please delete "at" after "chamber to".

<u>Column 10,</u>
Line 36, please insert -- titanium oxide, -- after "oxide,".

Signed and Sealed this

Nineteenth Day of April, 2005

JON W. DUDAS
*Director of the United States Patent and Trademark Office*